US008089707B2

(12) United States Patent
Bieg et al.

(10) Patent No.: US 8,089,707 B2
(45) Date of Patent: Jan. 3, 2012

(54) DIAPHRAGM CHANGING DEVICE

(75) Inventors: Hermann Bieg, Huettlingen (DE); Marcus Will, Neu-Ulm (DE); Thomas Bischoff, Aalen (DE); Yim-Bun Patrick Kwan, Aalen (DE); Uy-Liem Nguyen, Daettwil (CH); Stefan Xalter, Oberkochen (DE); Michael Muehlbeyer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 12/700,351

(22) Filed: Feb. 4, 2010

(65) Prior Publication Data

US 2010/0134777 A1 Jun. 3, 2010

Related U.S. Application Data

(63) Continuation of application No. 10/595,583, filed as application No. PCT/EP03/14551 on Dec. 18, 2003, now Pat. No. 7,684,125.

(30) Foreign Application Priority Data

Oct. 29, 2003 (DE) ................................ 103 50 545

(51) Int. Cl.
*G02B 9/00* (2006.01)

(52) U.S. Cl. ...................................................... 359/739

(58) Field of Classification Search .................. 359/739
See application file for complete search history.

(56) References Cited

U.S. PATENT DOCUMENTS

| | | | | |
|---|---|---|---|---|
| 5,646,770 A | | 7/1997 | Sato et al. | |
| 5,926,324 A | * | 7/1999 | Oono et al. | 359/696 |
| 6,030,081 A | * | 2/2000 | Kato | 351/212 |
| 6,445,510 B1 | | 9/2002 | Schuster et al. | |
| 6,639,696 B1 | | 10/2003 | Nishio | |

FOREIGN PATENT DOCUMENTS

| | | | |
|---|---|---|---|
| DE | 199 55 984 | | 5/2001 |
| DE | 101 11 299 | | 9/2002 |
| EP | 0969327 | A2 * | 6/1999 |
| EP | 0969327 | | 1/2000 |
| JP | 52-34850 | | 9/1993 |
| JP | 10-125590 | | 5/1995 |
| JP | 2002-509654 | | 3/2002 |
| JP | 2002-203767 | | 7/2002 |
| WO | WO 99/57606 | | 11/1999 |

* cited by examiner

*Primary Examiner* — James Greece
(74) *Attorney, Agent, or Firm* — Fish & Richardson P.C.

(57) ABSTRACT

The invention relates to an optical imaging device, in particular an objective 1 for microlithography in the field of EUVL for producing semiconductor components, having a beam path 2, a plurality of optical elements 3 and a diaphragm device 7 with an adjustable diaphragm opening shape. The diaphragm device has a diaphragm store 7*a*, 7*b* with a plurality of different diaphragm openings 6 with fixed shapes in each case, which can be introduced into the beam path 2.

23 Claims, 11 Drawing Sheets

DIAPHRAGM CHANGING DEVICE

CROSS-REFERENCE TO RELATED APPLICATIONS

This application is a continuation of, and claims benefit under 35 USC 120 to U.S. Ser. No. 10/595,583, filed Apr. 28, 2006, which claims benefit under 35 USC 371 of international application PCT/EP2003/014551, filed Dec. 18, 2003, which claims benefit of German Application No. 103 50 545.8, filed Oct. 29, 2003. The contents of U.S. Ser. No. 10/595,583 are hereby incorporated by reference in its entirety.

BACKGROUND OF THE INVENTION

1. Field of the Invention

The invention relates to an optical imaging device, in particular an objective for microlithography in the field of EUVL for producing semiconductor elements, having a beam path, a plurality of optical elements and a diaphragm device with an adjustable diaphragm opening shape.

2. Description of the Related Art

It is generally known to use various diaphragms as system diaphragms in optical imaging devices. The diameter of the light beam bundle in the beam path of the optical imaging device can be varied by means of these diaphragms, of which the opening diameter can be varied, in particular.

So-called iris diaphragms, which have at least four—but mostly more—thin blades which are generally in the shape of a sickle and are supported at one end rotatably in a fixed mount are particularly widespread. In this arrangement, the other end is provided as guiding device with a pin which is inserted in a groove or slot of a rotatable ring such that the rotation of the rotatable ring moves the blades in such a way that the remaining opening diameter for the diaphragm can be varied.

DE 101 11 299 A1 discloses such an iris diaphragm, in particular for an exposure objective in semiconductor lithography, having a plurality of blades which are guided with the aid of guide elements, and can be moved by at least one drive device for the purpose of adjusting the diaphragm opening. The guide elements are designed such that the blades can be moved in an at least approximately linear fashion in a radial direction in relation to the optical axis of the iris diaphragm.

DE 199 55 984 A1 discloses a further diaphragm for stopping down an optical imaging device.

Known diaphragms, in particular the iris diaphragms which can be adjusted continuously via blades, are less suitable for use in stopping down an optical system used in microlithography, chiefly in the field of EUVL, since more stringent demands are placed here on the installation space available, which these cannot satisfy because of their construction.

SUMMARY OF THE INVENTION

It is therefore the object of the present invention to create an optical imaging device of the type mentioned at the beginning which can be stopped down with the aid of a diaphragm which requires only a small installation space.

This object is achieved according to the invention by virtue of the fact that the diaphragm, device has a diaphragm store with a plurality of different diaphragm openings with fixed shapes in each case, which can be introduced into the beam path.

The measures according to the invention create in a simple and advantageous way an optical imaging device having a diaphragm mechanism in the case of which the shapes of the diaphragm openings are permanently determined and can be stored in a very small space. There are no restrictions on the geometry of the shapes of the diaphragm openings, and so both circular and elliptical or other geometries can be used for the diaphragm openings. By contrast with the known blade-type iris diaphragms, the masses to be moved are comparatively small, and so changing the diaphragms in the optical imaging device can be undertaken very quickly. The most varied types of diaphragms can be brought into use by means of the existing diaphragm store with diaphragm openings.

It is very advantageous when the diaphragm store is designed as a revolving disc diaphragm stack, in particular arranged outside the optical imaging device, with a plurality of revolving disc diaphragms which are provided with diaphragm openings and are, in particular, accommodated in separate plug-in units.

These measures yield a further space-saving design of the diaphragm device, in particular outside the optical imaging device, as a result of which comparatively many different revolving disc diaphragms can be stored in the revolving disc diaphragm stack. By contrast with an inner arrangement, the arrangement of the diaphragm device outside the optical imaging device additionally minimizes contamination of the optical imaging device by the diaphragm device. Moreover, the diaphragm device can be dynamically decoupled from the optical imaging device such that no disturbing vibrations are introduced by the diaphragm device to the optical elements arranged in the optical imaging device.

Moreover, it can be provided in one structural configuration of the invention that a sheet-metal strip which is wound onto two rollers and held tensioned is provided as a diaphragm store, the sheet-metal strip having a plurality of, in particular, various diaphragm openings of fixed shapes, and it being possible by rotating the rollers to adjust the diaphragm setting by varying the diaphragm openings.

This results in a very highly dynamic adjustment of the various diaphragms, which can be stored in a very small space. The masses to be moved are comparatively small and there are no restrictions on the geometry of the diaphragm openings. Changing diaphragms can be undertaken speedily.

Advantageous refinements and developments of the invention arise from the further subclaims. Various embodiments of the invention are explained in principle below with the aid of the drawings.

DETAILED DESCRIPTION

Figure 1A:
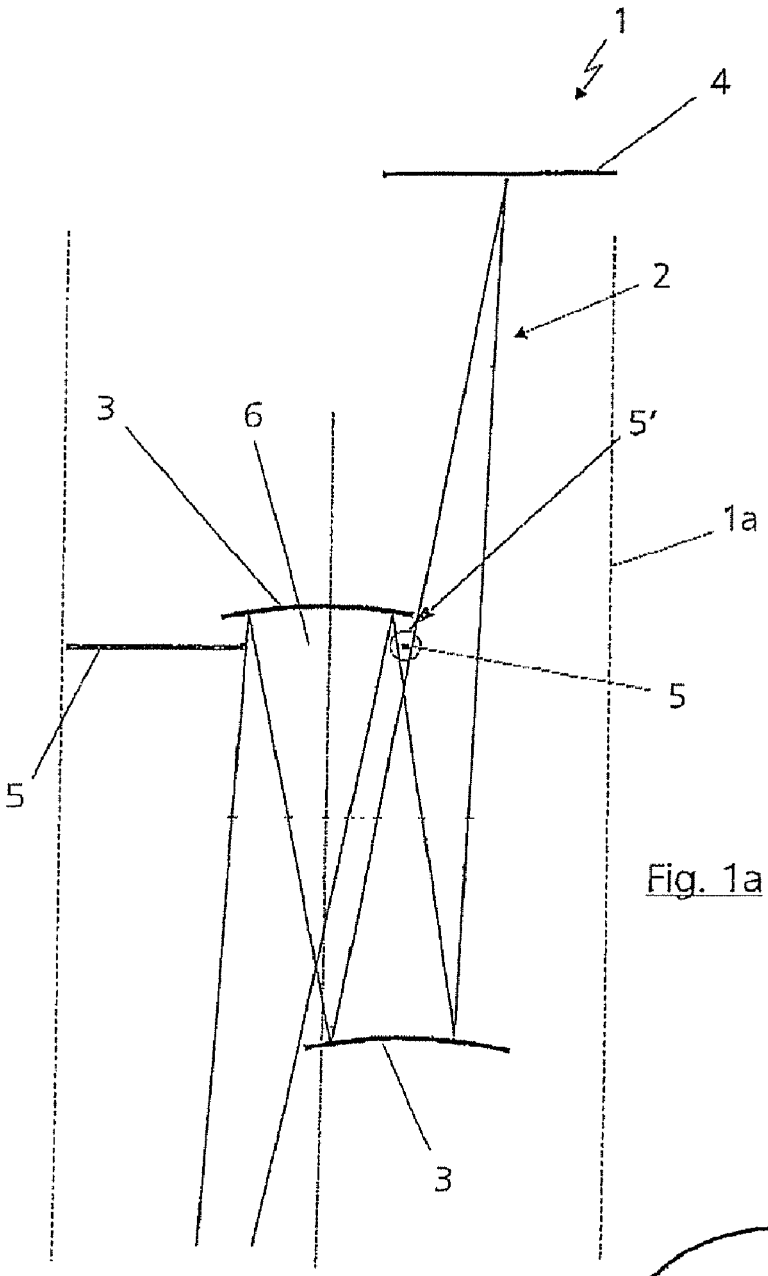
FIG. 1*a* shows a detail of a projection objective for microlithography in the field of EUVL, with a typical beam path.
Figure 14:
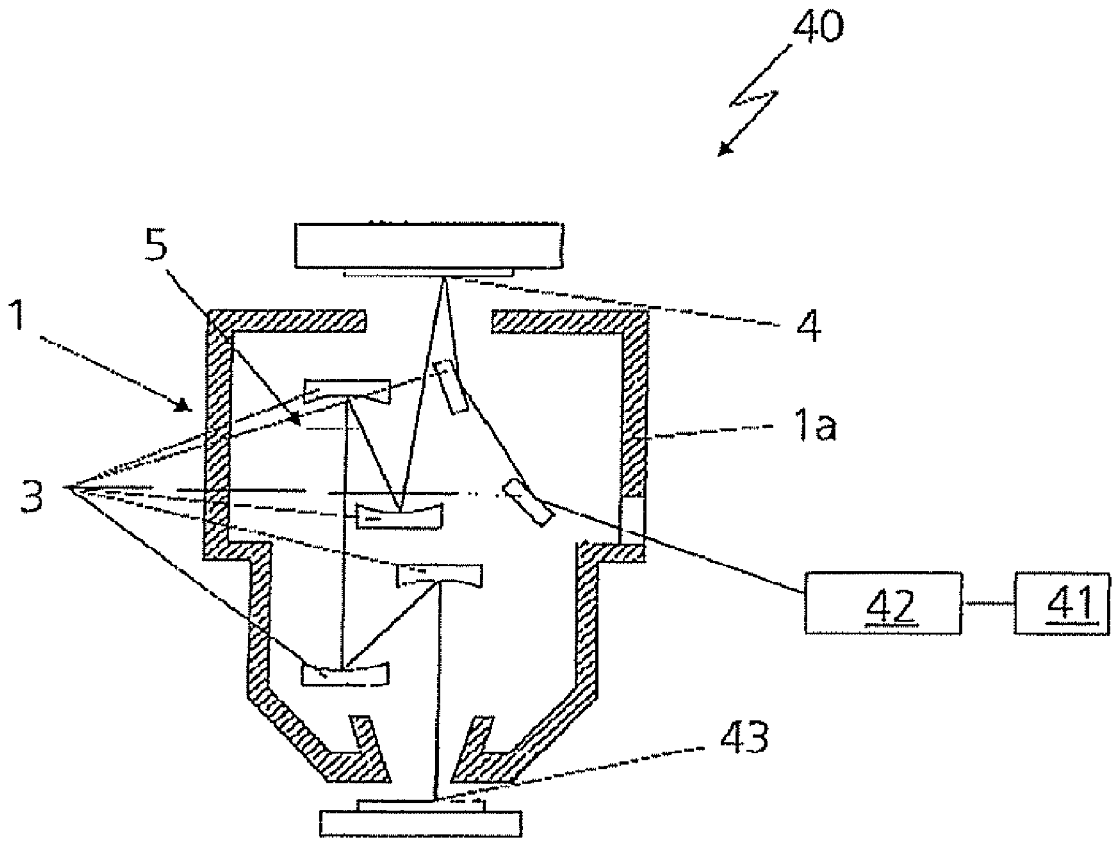
FIG. 14 shows the principle of the design of an EUV projection exposure machine with a light source, an illuminating system and a projection objective.

FIG. 1*a* shows a detail of a projection objective 1 for use in the field of EUVL, with its typical beam path 2 between mirrors 3 arranged on a housing 1*a*, illustrated by dashes, of the projection objective 1, and an object plane 4 (explained in more detail in FIG. 14). Arranged in the beam path 2 is a diaphragm 5 with a diaphragm opening 6 which serves to stop down the light beam of the projection objective 1.

Figure 1B:
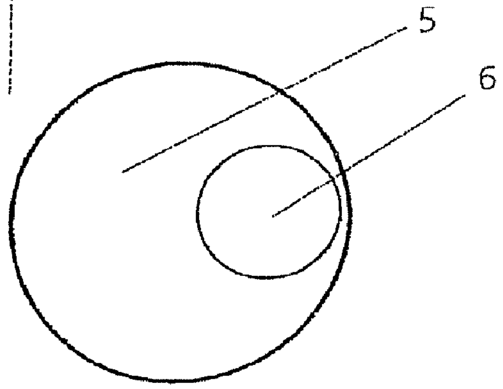
FIG. 1*b* shows a view from above of a revolving disc diaphragm suitable for the projection objective in accordance with FIG. 1*a;*

As may be seen, stringent requirements are placed on the nature and the installation space of the diaphragm 5 here. This is required principally on a side 5' of the diaphragm 5 that is emphasized by a circle. Consequently, the diaphragm opening 6 should be decentral as illustrated in FIG. 1*b*. This requisite arrangement of the diaphragm opening 6 on the diaphragm 5, as well as the small installation space in the projection objective 1 complicate the use of conventional, continuously adjustable iris diaphragms (for example, by means of blades) in the case of such a projection objective 1, in particular in the case of operating wavelengths in the field of EUVL.

Figure 2:
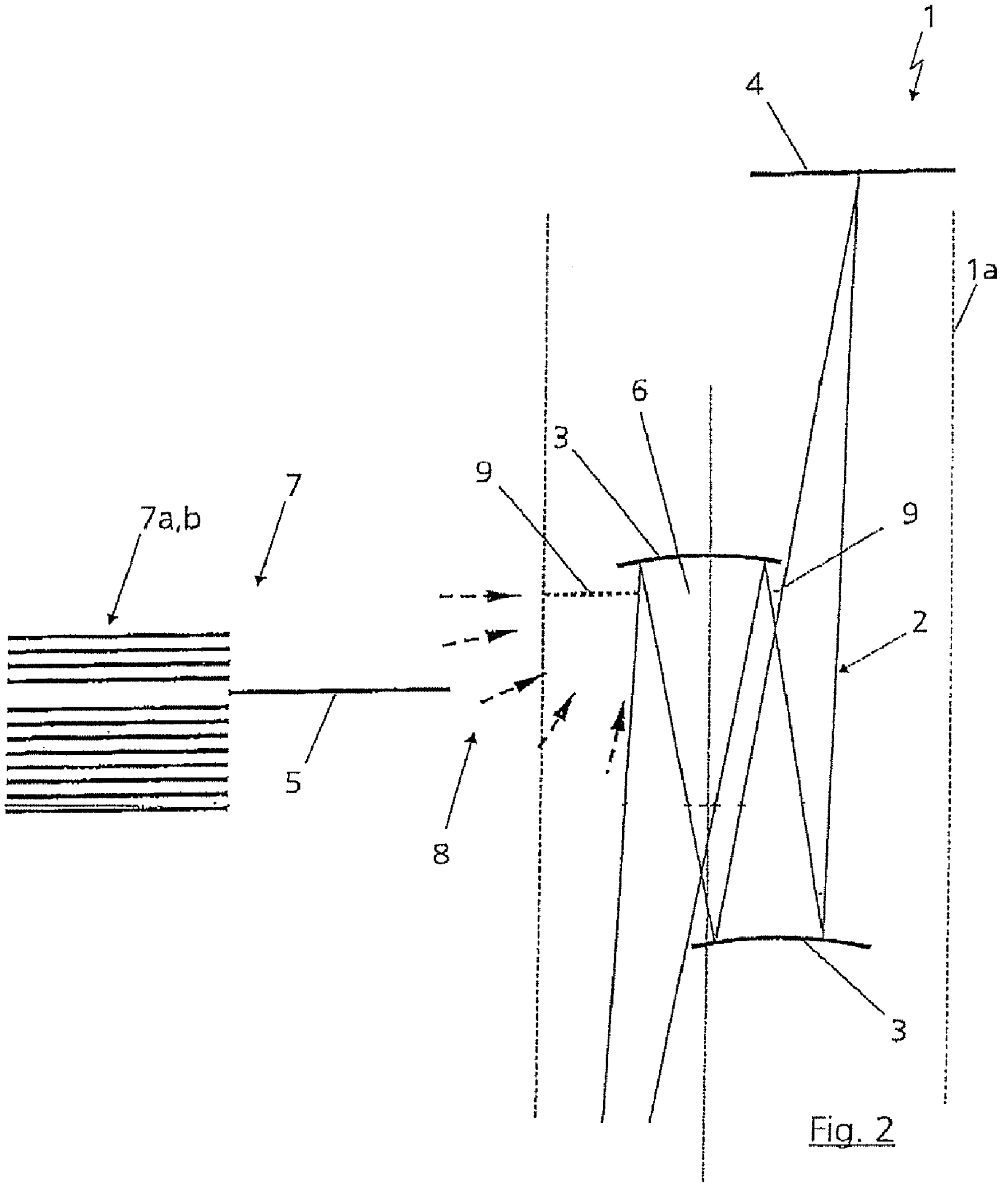
FIG. 2 shows an illustration of a revolving disc diaphragm stack with a plurality of revolving disc diaphragms which can be introduced into the beam path of the projection objective in accordance with FIG. 1*a;*

FIG. 2 shows the detail of the projection objective 1 in a design with a diaphragm device 7 with a revolving disc diaphragm stack 7*a*, 7*b*, which has individual diaphragms 5, designed as revolving disc diaphragms, with fixed geometries (see FIG. 1*b*) stacked vertically one above another. The diaphragm openings 6 can also have elliptical or other shapes instead of the circular shape illustrated. The revolving disc diaphragms 5 are preferably brought into the beam path 2 of the projection objective 1 to an operating position 9 (indicated by dots) provided therefor via directions indicated by arrows 8. As may be seen from FIG. 1*b*, the revolving disc diaphragms 5 are shaped in such a way that they have a thin rim on the side of the neighbouring light beam, and a broad rim over the remainder of the circumference.

Figure 3A:
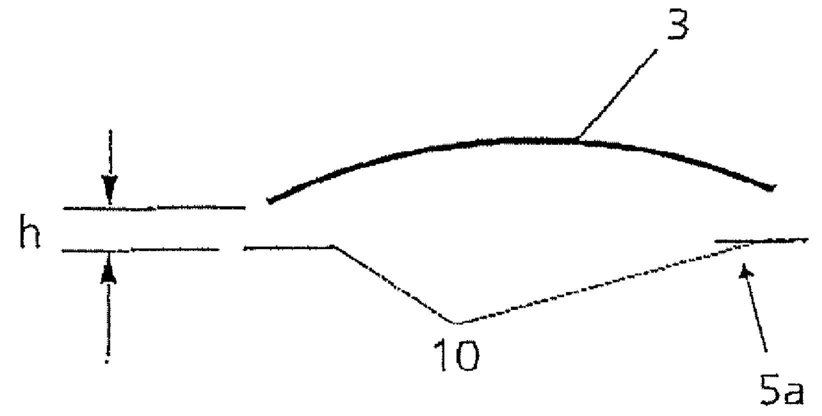
FIGS. 3*a* to 3*c* show side views of three embodiments of a revolving disc diaphragm.
Figure 3B:
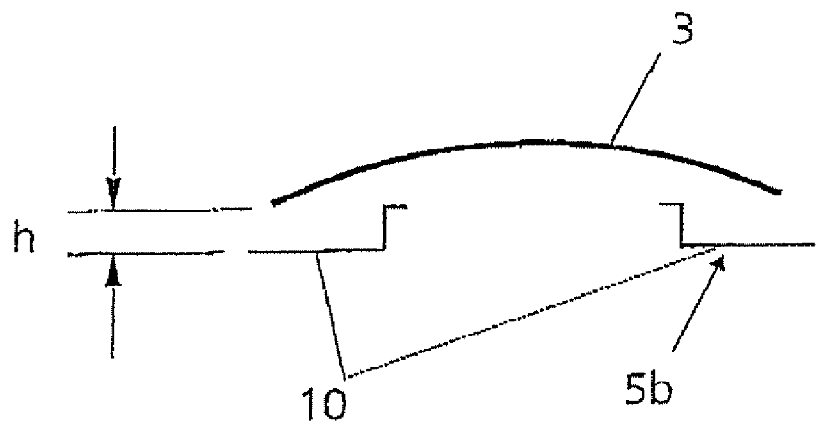
Figure 3C:
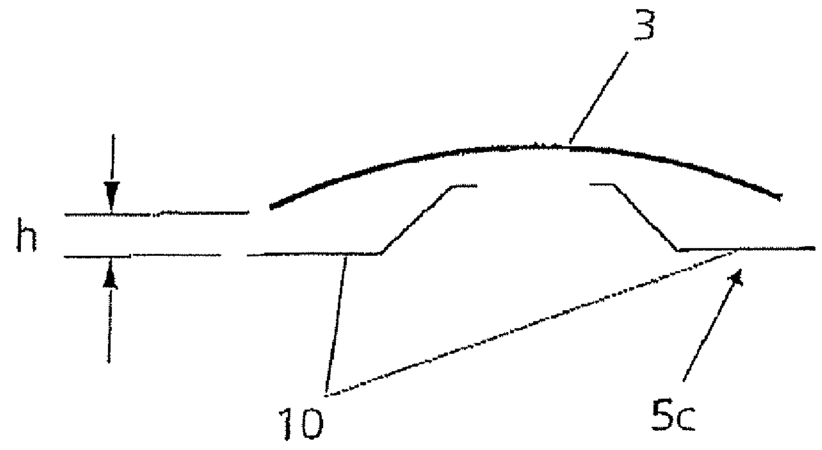

As may be seen in FIGS. 3*a* to 3*c*, the optimum physical spacing of revolving disc diaphragms 5*a* to 5*c* is different for different sizes of diaphragm in relation to the mirrors 3 arranged upstream thereof in the beam direction. In order to be able to ensure this when mounting the revolving disc diaphragms 5*a* to 5*c* at a uniform height h with reference to the mirrors 3, the latter are provided with different heights with reference to the ranges 10 of their mountings.

Figure 4A:
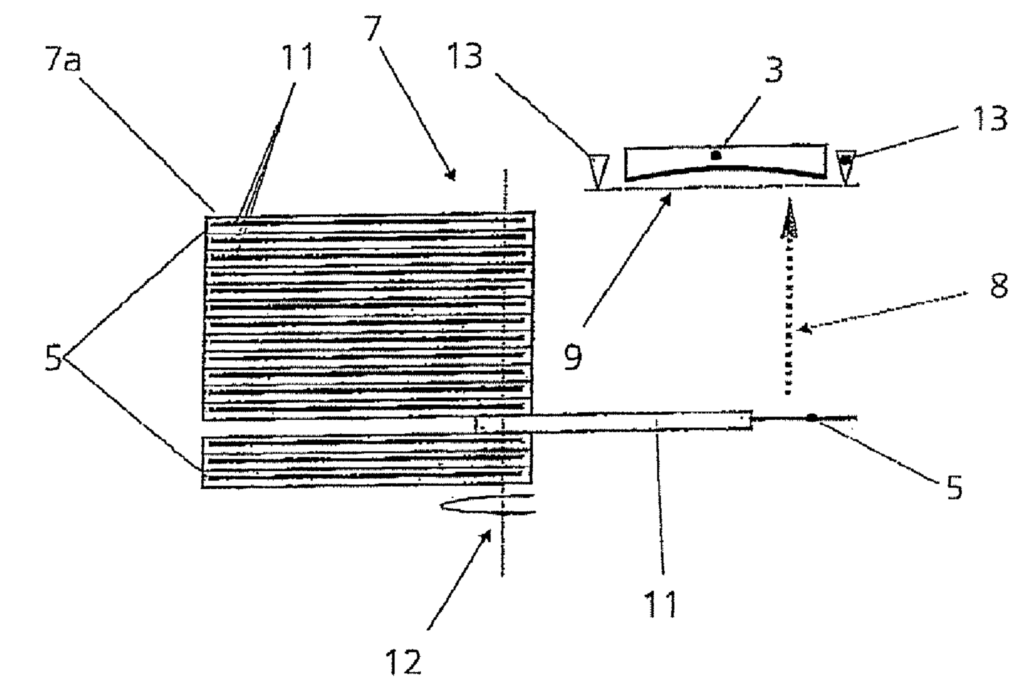
FIGS. 4*a* to 4*c* show illustrations of three embodiments of a diaphragm device with a revolving disc diaphragm stack.

As illustrated in FIG. 4*a*, the revolving disc diaphragm stack 7*a* has a plurality of revolving disc diaphragms 5 which are accommodated in separate plug-in units 11. Each plug-in unit 11 can be rotated out (indicated by the arrow 12 in FIG. 4*a*) individually by means of an articulated element (not illustrated) common to all the plug-in units 11, such that in each case one revolving disc diaphragm 5 can be rotated out in order subsequently to be lifted (indicated in FIG. 4*a* by the dotted arrow 8) into the beam path 2 of the projection objective 1 to its operating position 9, as explained at a later point in time. The swivelling movement of the plug-in units 11 can be accomplished by means of a gearwheel drive which is fitted on a lifting mechanism or a module housing and can be arranged in such a way that it moves the gearwheel teeth as the plug-in unit 11 passes. Alternatively, in other exemplary embodiments it would also be possible to provide other drive mechanisms, in particular friction wheels, magnetic clutches or special electric motors with rotors which are installed in the plug-in units 11.

In the present exemplary embodiment, the plug-in units 11 have a uniform overall height. In other exemplary embodiments, however, these can also differ in order to be able to use various sizes of diaphragm (compare FIGS. 3*a* to 3*c*).

After the operating position 9 of the revolving disc diaphragm 5 is reached, the latter is coupled to a holding device or to a stop 13. The holding device 13 permits a repeatably accurate positioning of the revolving disc diaphragms 5 in the micrometer range. This reduces the accuracy requirements for the separate plug-in units 11, and also for the overall lifting mechanism (indicated by the arrow 8).

Figure 4B:
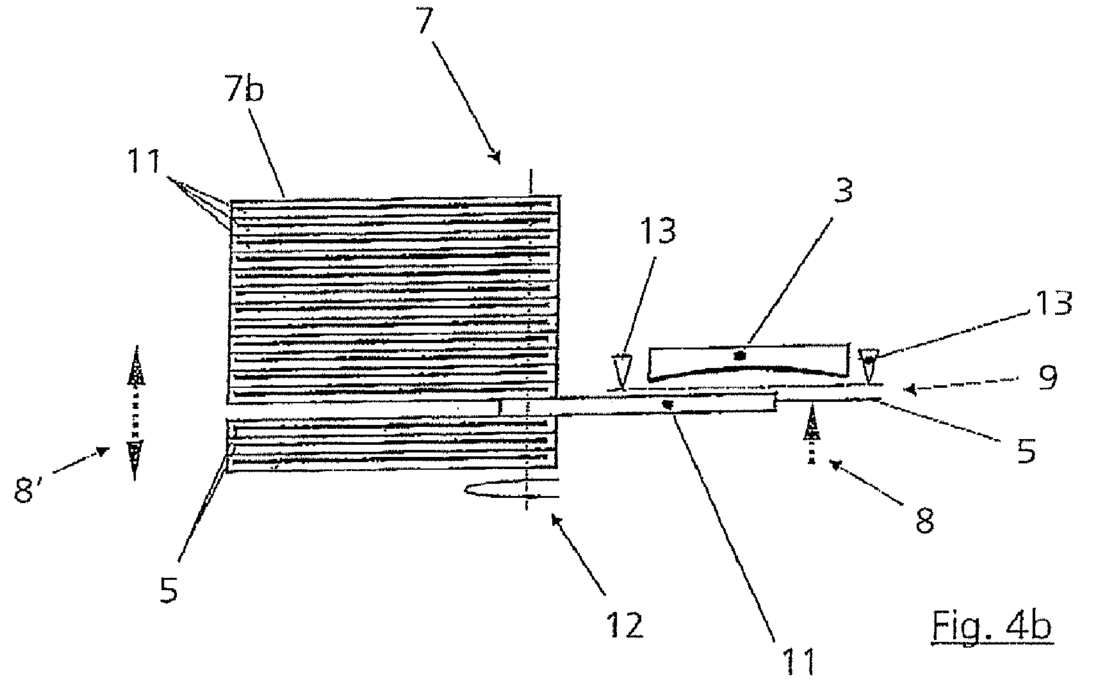
Figure 4C:
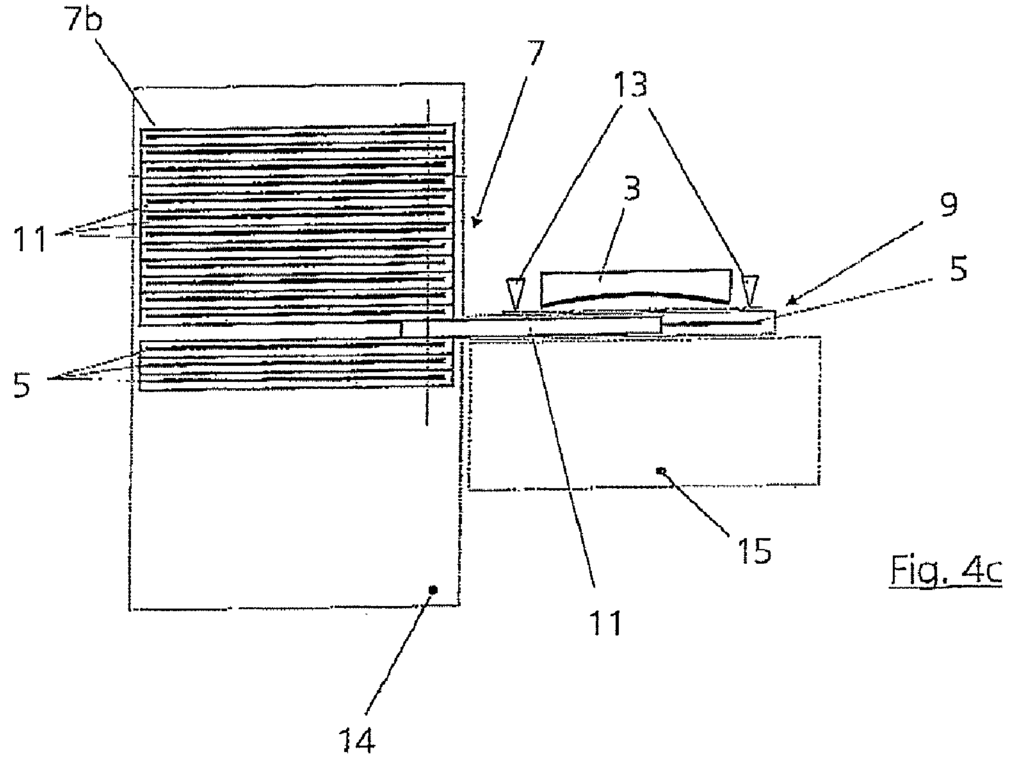

As may be seen from FIG. 4*b*, instead of lifting the revolving disc diaphragms 5 to the operating position 9 it is also possible in a further embodiment to move a revolving disc diaphragm stack 7*b* vertically (indicated by the arrow 8') until the appropriate revolving disc diaphragm 5 has reached substantially the same height as the holding device 13, after which the plug-in unit 11 with the appropriate revolving disc diaphragm 5 is rotated out and coupled to the holding device 13 after a possible additional slight vertical movement (arrow 8). This embodiment has the advantage that the diaphragm exchange mechanism requires only very little space in front of the mirror 3, the result being to release this space for additional systems (mirror cleaning systems etc.). An operating range 14 of the vertically displaceable revolving disc diaphragm stack 7*b* is illustrated by dashes or dots and dashes in FIG. 4*c*, as is a free region for additional systems 15.

Especially for the field of EUVL, projection objectives 1 are very sensitive to movements of their individual optical elements, for example mirror 3, both relative to one another and relative to the structure of their mountings. In order to minimize the transmission of interfering vibrations, the projection objective 1 is isolated from vibrations. Moreover, the individual elements inside the projection objective 1 are connected to one another rigidly (with a high natural frequency) in such a way that they move with one another as a rigid body when excited by any residual vibrations, which are usually of low frequency.

It is a complicated undertaking to create an embodiment of the overall diaphragm device 7 with a sufficiently high natural frequency, since relatively large masses have to be moved and the installation space is restricted. Consequently, dynamic movements (vibrations) would be transmitted to the overall projection objective 1 by the diaphragm device 7. The relative positioning of the diaphragm 5 in relation to the remaining optical elements of the projection objective 1 is less critical in general, however.

A possible solution to this problem is for the entire diaphragm device 7 to be mounted on a separate structure dynamically decoupled from the projection objective 1, but this would make positioning the diaphragm exactly in the projection objective 1 more difficult.

A further solution consists in separating the selected revolving disc diaphragm 5 with the holding device 13 from the remainder of the diaphragm device 7 (revolving disc diaphragm stacks 7*a*, 7*b*, plug-in units 11, lifting mechanism, housing, etc.) and arranging them on different structures, the holding device 13 being fastened directly on the optical imaging device or on the projection objective 1. The remainder of the diaphragm device 7 can be mounted on a separate structure.

A further possible solution consists in fastening both the holding device 13 and the lifting mechanism 16 on the projection objective 1, while the remainder of the diaphragm device 7 is mounted on a separate structure.

The holding device 13 ensures that the revolving disc diaphragm 5 is positioned accurately relative to the projection objective 1 and in six degrees of freedom. Furthermore, there is also a need to hold or lock the revolving disc diaphragms 5 in the holding device 13 against the gravity force and other interfering forces. In order to prevent particles from contaminating the mirror surfaces, the revolving disc diaphragm 5 should be locked as gently as possible.

Figure 5:
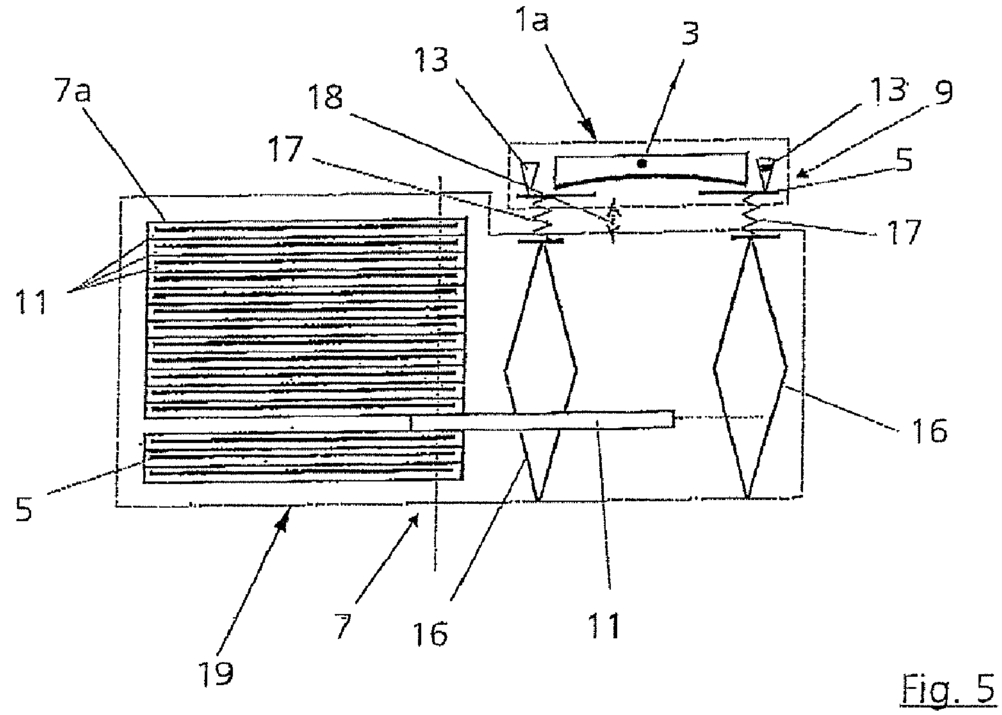
FIG. 5 shows a view of a diaphragm device with a lifting device, a holding device and with spring elements as stop for a revolving disc diaphragm.

As sketched in FIG. 5, the revolving disc diaphragm 5 is conveyed by means of a lifting device 16 from a removal position into its operating position 9, and held there in the holding device 13. In the case of the diaphragm device 7 illustrated in FIG. 5, use was advantageously made of mainly rotary mechanisms in the diaphragm exchange mechanism since, by contrast with translation mechanisms, fewer particles causing contamination, for example, by friction forces, are produced. As illustrated further in FIG. 5, the essentially constant force for holding the revolving disc diaphragm 5 in the holding device 13 is effected in a simple and advantageous way by spring elements 17 of low stiffness. The spring elements 17 should be precompressed in order to avoid a large compression deflection of the spring elements 17 relative to the operating position 9 of the revolving disc diaphragm 5. An arrow 18 indicates the dynamic decoupling or the vibrational decoupling of the separately-mounted housing 1*a* of the projection objective 1 (indicated by dashes) and of the remainder of the diaphragm mechanism (dashed box 19), likewise mounted separately.

Figure 6A:
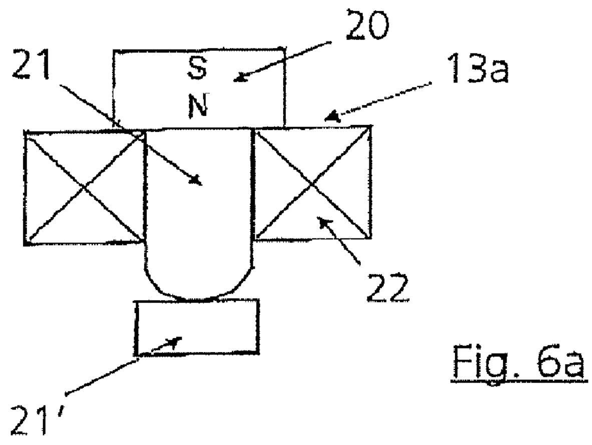
FIGS. 6*a* to 6*c* show illustrations of three embodiments of electromagnetic holding devices for positioning the revolving disc diaphragm.
Figure 6B:
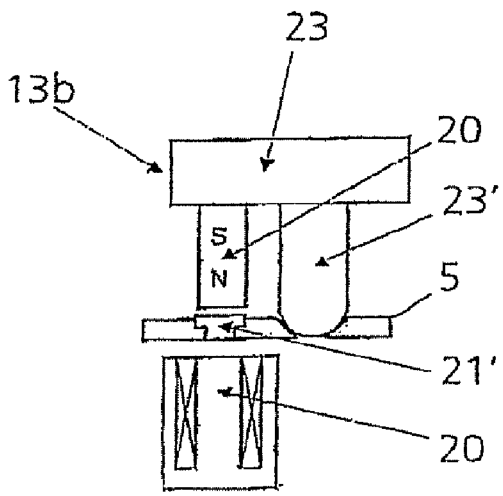
Figure 6C:
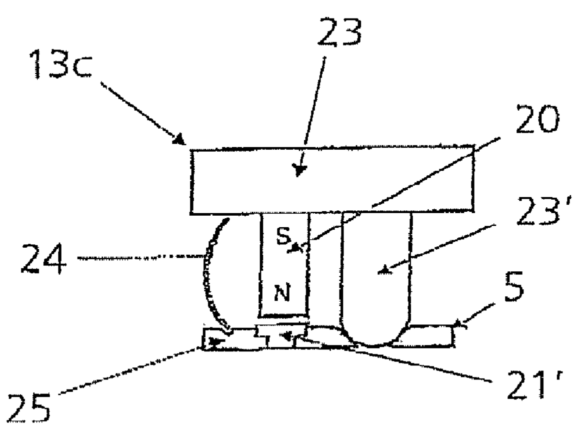

FIGS. 6*a* to 6*c* illustrate various embodiments of the holding device 13 for fixing and/or positioning the revolving disc diaphragm 5.

As may be seen from FIG. 6*a*, a holding device 13*a* has a permanent magnet 20 and a soft iron core 21 with a coil winding 22. The revolving disc diaphragms 5 (not illustrated in more detail here) likewise have a soft iron core 21' on the opposite side and are thereby held via magnetic forces. This has the advantage that there are only a few or no open mechanically moveable parts which could lead to further instances of particle contamination.

As is illustrated in FIG. 6*b*, a holding device 13*b* is provided on a part 23, and has a static part 23' and the permanent magnet 20. The revolving disc diaphragm 5 has the soft iron core 21 by means of which the revolving disc diaphragm 5 is held on the holding device 13*b*. In addition, the lifting device 16 (not illustrated in more detail in FIG. 6*b*) has a switchable electromagnet 20' which is switched in the event of an exchange of diaphragms in such a way that the diaphragm is loosened from the holding device 13*b*.

Illustrated in FIG. 6*c* is a third embodiment of a holding device 13*c* which corresponds in essence to the holding device 13*b* from FIG. 6*b*. A soft spring element 24 which engages in a cut-out 25 in the revolving disc diaphragm 5 has been inserted here in addition.

Figure 7A:
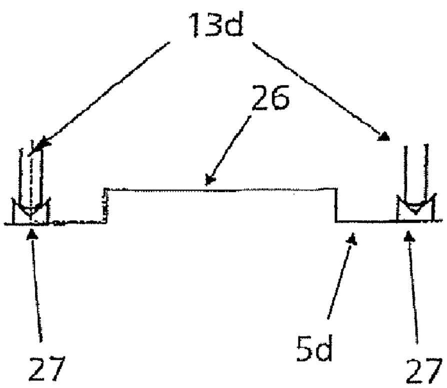
FIGS. 7*a* and 7*b* show illustrations of two embodiments of a contamination monitoring means for a mirror.

FIG. 7*a* shows a holding device 13*d* with a revolving disc diaphragm 5*d*. A mirror contamination monitoring means is provided here, in addition. This is effected by fine tungsten lead wires 26 which are guided via the opening in the revolving disc diaphragm 5. The revolving disc diaphragm 5*d* is fabricated for this purpose from an insulating material such as, for example, a ceramic or similar. The electrical connection with the tungsten lead wires 26 is achieved by three contact points on bearing points 27 of the revolving disc diaphragm 5*d*.

Figure 7B:
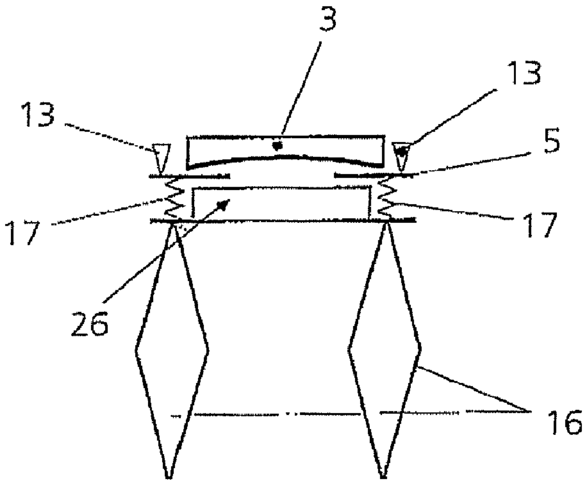

FIG. 7*b* shows an alternative embodiment of a contamination monitoring means. Here, the tungsten lead wires 26 are integrated in the lifting device 16.

Figure 8:
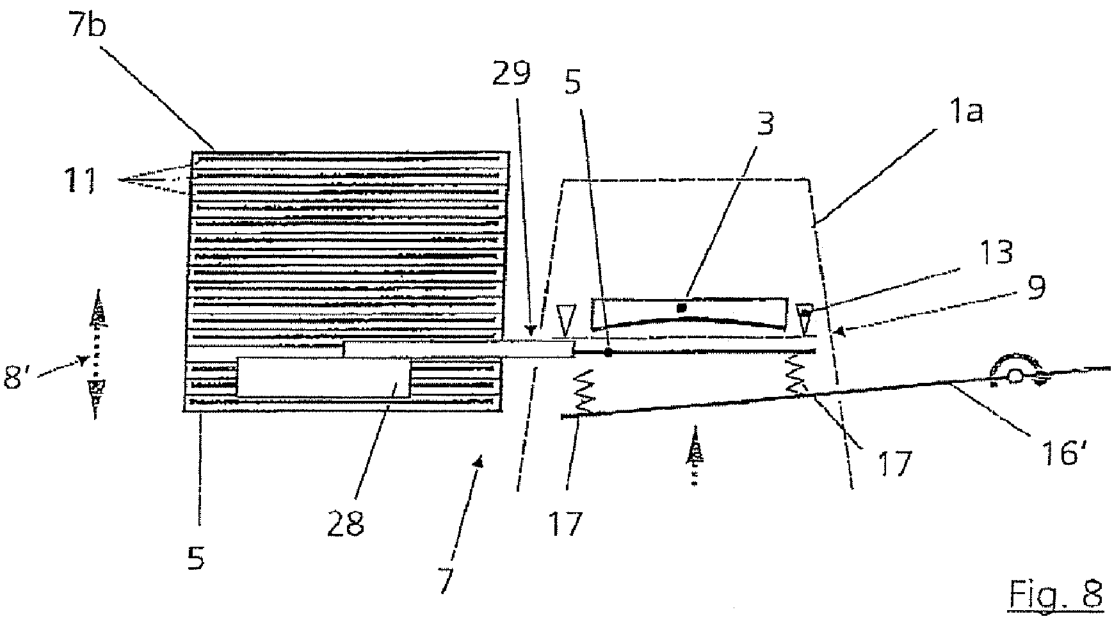
FIG. 8 shows a side view of an inventive external diaphragm device with a lifting device.

As may be seen from FIG. 8, the vertically displaceable revolving disc diaphragm stack 7*b* is arranged outside the projection objective 1 or the housing 1*a* thereof. This protects the projection objective 1 against contamination by the revolving disc diaphragm stack 7*b*. The revolving disc diaphragm stack 7*b* is provided with a feeder device 28 which is designed as a moveable robot gripper arm, removes the corresponding revolving disc diaphragm 5 from the revolving disc diaphragm stack 7*b* and inserts it into the beam path 2 of the projection objective 1 through an opening 29 provided for the purpose. An additional lifting device 16' (illustrated in a simplified fashion), likewise arranged outside the projection objective 1, conveys the revolving disc diaphragm 5 to the holding device 13, it then being fixed in its operating position 9. As already described above, the diaphragm exchange mechanisms and the lifting device 16' can be mounted in a dynamically decoupled fashion on different structures. Soft springs 17 of the lifting device 16' ensure a dynamically decoupled connection. The opening 29 in the projection objective 1 or the housing 1*a* is closed during operation.

Figure 9:
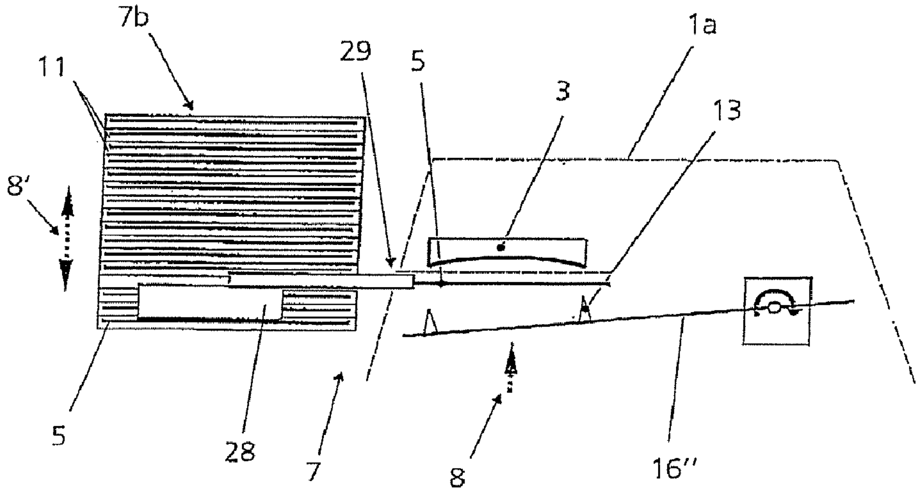
FIG. 9 shows a side view of a further embodiment of a diaphragm device with a lifting device.

In FIG. 9, a lifting device 16" is introduced and mounted inside the housing 1*a* of the projection objective 1. Surfaces which slide or roll on one another are reduced to an absolute minimum in order to avoid or to minimize particle contamination. This can be implemented by using solid joints and appropriate actuators (voice coil actuator, Lorentz actuator). Surfaces are minimized in order to avoid instances of molecular contamination and, moreover, use is made only of suitable materials with low degassing rates (steels, no plastics or lubricants). Lubrication on bearings can be dispensed with by using solid joints. The mass is to be kept small or the natural frequency of the lifting device 16" is to be kept as high as possible in order not to impair the structure of the projection optics dynamically.

As may further be seen from FIG. 9, the lifting device 16" has the holding device 13 for the revolving disc diaphragm 5. The revolving disc diaphragm 5 constructed as sheet metal is situated on the feeder device 28. The feeder device 28 brings the revolving disc diaphragm 5 into the projection optics below the mirror 3. The revolving disc diaphragm 5 is lifted from the feeder device 28 when the lifting device 16" is raised. The lifting device 16" drives against an inner stop.

The revolving disc diaphragm 5 lies on the holding device 13 because of its own weight. Raising upwards can be prevented for example by means of a protective cover (compare FIG. 10*a*). The revolving disc diaphragm 5 cannot then fall out or collide with the mirror 3.

Figure 10A:
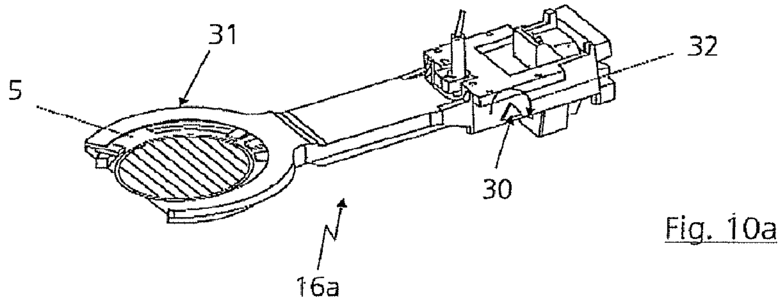
FIGS. 10*a* to 10*c* show perspective views of three embodiments of a lifting device.
Figure 10B:
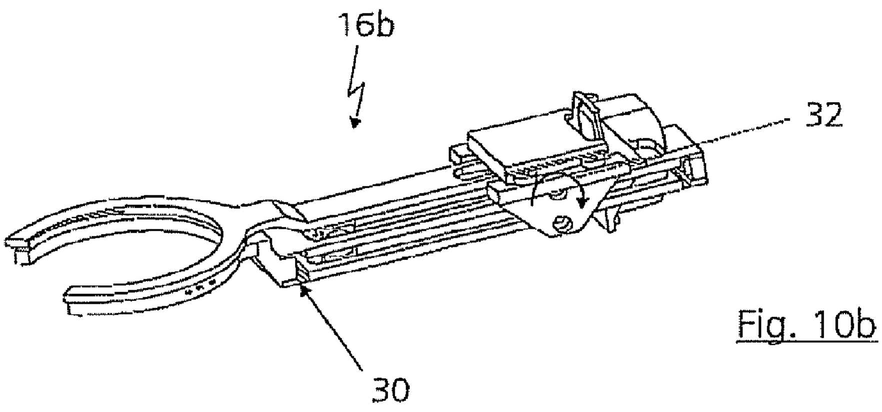
Figure 10C:
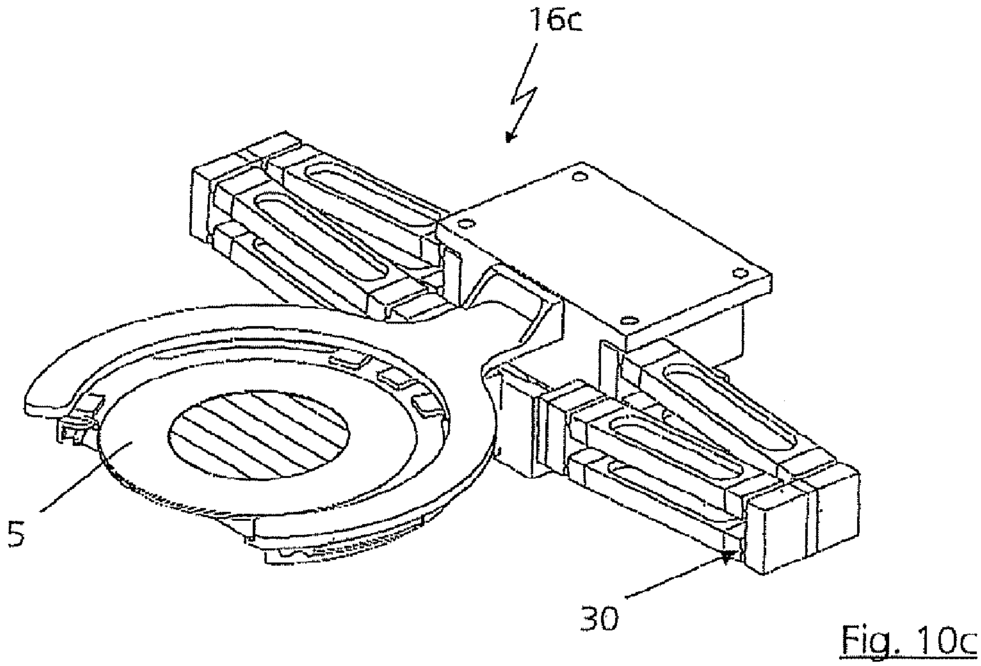

The following FIGS. 10*a* to 10*c* show structural configurations 16*a*, 16*b*, 16*c* of the lifting device 16" from FIG. 9. They have voice coil actuators (not shown in more detail) for manipulation. Rotary joints are respectively designed as solid joints 30.

As illustrated in FIG. 10*a*, a protective cover 31 prevents the lifting device 16*a*, constructed as a rocker, from raising the revolving disc diaphragm 5. The lifting devices 16*a* to 16*c* have internal end stops which prescribe the respective end positions of the lifting movement. The steering movement of the lifting device 16*a* is indicated by an arrow 32.

FIG. 10*b* shows the lifting device 16*b*, which is designed as a set of scales and has a parallelogram guide. It is advantageous in this case that the revolving disc diaphragm 5 can be moved upwards virtually vertically.

A pantographic lifting device 16*c* is sketched in FIG. 10*c*.

Figure 11:
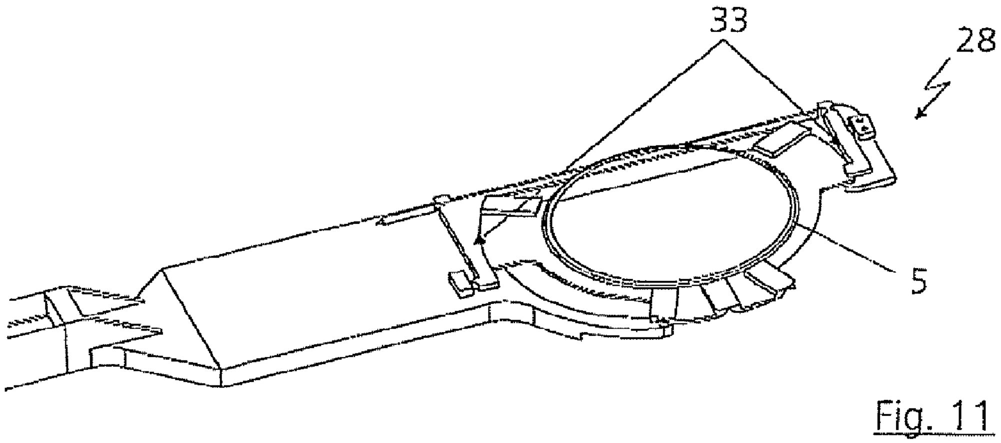
FIG. 11 shows a perspective view of a robot gripper arm for unloading a revolving disc diaphragm stack.

FIG. 11 shows the feeder device 28 designed as a robot gripper arm. The revolving disc diaphragm 5 can be withdrawn from below by the lifting device 16*a*, 16*b*, 16*c* from the receptacle of the feeder device 28. A locking mechanism 33 fastens the revolving disc diaphragm 5 during transport. In other exemplary embodiments the revolving disc diaphragm 5 can also be configured symmetrically such that fitting may be done from both sides. The feeder device 28 can, in addition, be designed as a double gripper, that is to say with two receptacles for two revolving disc diaphragms 5 (not illustrated). The time for changing diaphragms is thereby substantially shortened. During changing, the feeder device 28 moves with a revolving disc diaphragm 5 into the projection optics of the projection objective 1. The exchange revolving disc diaphragm 5, which is already located in the projection optics, is deposited on the second (empty) receptacle. The new revolving disc diaphragm 5 would be taken over by the lifting device 16*a*, 16*b*, 16*c*. During a change of diaphragm, the feeder device 28 would therefore have to move one less time into the projection optics.

Figure 12:
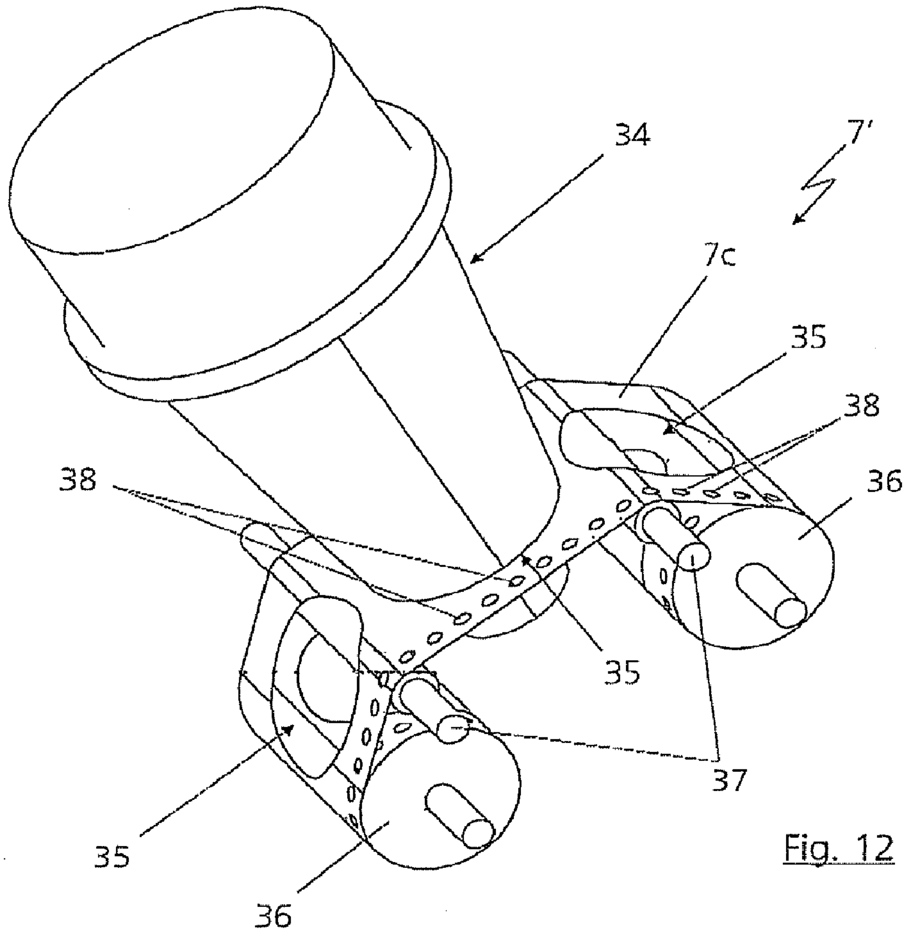
FIG. 12 shows a perspective view of a further embodiment of the diaphragm device with two rollers on which a sheet-metal strip is wound.

A further embodiment of a diaphragm device 7' for the projection objective 1 is illustrated in FIG. 12. The great advantage here is the improved dynamics of the change of diaphragm in conjunction with a small required installation space. As may be seen, an incident light beam 34 is stopped down by a sheet-metal strip 7*c*. The latter is provided with openings 35 which, depending on optical requirement exhibit an optimum fixed geometry. The further openings 35 are incised adjacently as diaphragms on the sheet-metal strip 7*c*. The sequence of the openings 35 can be varied in order to ensure optimum speed in changing diaphragms, depending on the requirements.

The sheet-metal strip 7*c* is wound onto two rollers 36. These are driven and tensioned such that the sheet-metal strip 7*c* has no “folds”. Two additional tensioning and guiding rollers 37 are fitted in order to avoid diaphragms which shift in the light direction. As a result, the changing diameter of the rollers 36 (including wound-on sheet-metal strip 7*c*) is, in particular, not rendered noticeable by an oblique position of the sheet-metal strip 7*c*.

The optimum position of the diaphragm openings 35 can be measured, using appropriate sensors (not illustrated) via markings 38 at the edge of the sheet-metal strip 7*c*. However, other methods are also conceivable in further exemplary embodiments.

Figure 13:
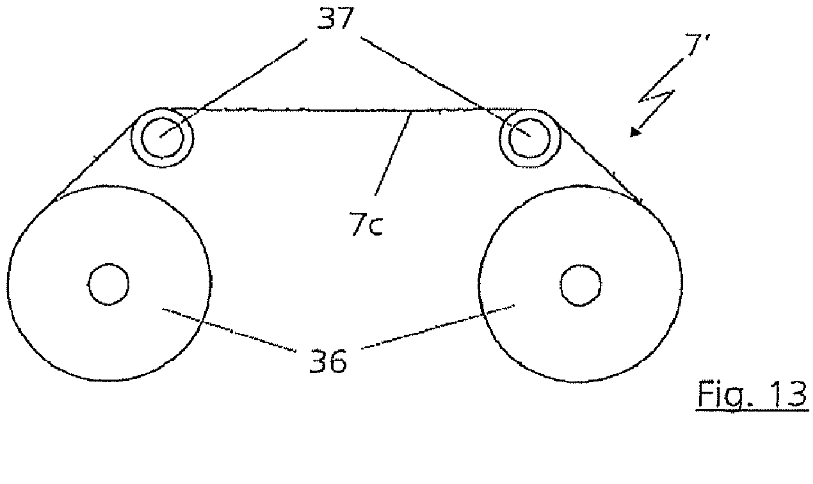
FIG. 13 shows a side view of the diaphragm device from FIG. 12.

A front view of the diaphragm device 7' from FIG. 12 is illustrated in FIG. 13.

As may be seen from FIG. 14, an EUV projection exposure machine 40 has a light source 41, an EUV illuminating system 42 for illuminating a field in the object plane 4 in which a pattern-bearing mask is arranged, and the projection objective 1 with the housing 1*a* and the beam path 2 (indicated by dashes) for imaging the pattern-bearing mask in the object plane 4 onto a photosensitive substrate 43. The diaphragm 5 for stopping down the projection objective 1 is indicated by dots.

What is claimed is:

1. An optical imaging device, comprising:

a plurality of optical elements disposed in a beam path;

a diaphragm having an opening, a first region and a second region, the second region of the diaphragm being inward of the first region of the diaphragm along a radial direction of the diaphragm; and a storage device capable of storing the diaphragm, wherein:

the storage device is outside the beam path of the plurality of optical elements;

the diaphragm is transferrable between a first location in the storage device and a second location in the beam path; and the second region of the diaphragm extends outward relative to the first region of the diaphragm along a direction perpendicular to the radial direction of the diaphragm.

2. The optical imaging device of claim 1, wherein the second region of the diaphragm defines the opening of the diaphragm.

3. The optical imaging device of claim 1, wherein, when the diaphragm is in the second position:

the plurality of optical elements includes a first optical element that is closest to the diaphragm; and a distance between the second region of diaphragm and the first optical element is less than a distance between the first region of the diaphragm and the first optical element.

4. The optical imaging device of claim 1, wherein the diaphragm has a third region between the first and second regions, and the third region of the diaphragm is nonparallel with respect to the first and second regions of the diaphragm.

5. The optical imaging device of claim 4, wherein the first region of the diaphragm is parallel to the second region of the diaphragm.

6. The optical imaging device of claim 1, wherein the first region of the diaphragm is parallel to the second region of the diaphragm.

7. The optical imaging device of claim 1, wherein the plurality of optical elements comprises a mirror.

8. The optical imaging device of claim 1, wherein the plurality of optical elements comprises a plurality of mirrors.

9. The optical imaging device of claim 1, wherein the plurality of optical elements are configured to be used with extreme ultraviolet radiation.

10. The optical imaging device of claim 1, wherein the optical imaging devices includes an objective, and the objective comprises the plurality of optical elements having the beam path.

11. The optical imaging device of claim 10, wherein the objective further comprises a housing, the plurality of optical elements being in the housing.

12. The optical imaging device of claim 11, wherein the storage device is located outside the housing.

13. The optical imaging device of claim 12, wherein the housing has an opening configured so that the diaphragm can be moved therethrough when being transferred between the first and second positions.

14. The optical imaging device of claim 1, wherein:

the storage device comprises a plurality of diaphragms, including a second diaphragm having an opening, a first region and a second region, the second region of the second diaphragm being inward of the first region of the second diaphragm along a radial direction of the second diaphragm;

the second diaphragm is transferrable between a first location in the storage device and a second location in the beam path; and the second region of the second diaphragm extends outward relative to the first region of the second diaphragm along a direction perpendicular to the radial direction of the second diaphragm.

15. A system, comprising:

a microlithography objective having a beam path, the microlithography objective comprising a housing and a mirror, the mirror being in the housing, the mirror being in the beam path, the housing having an opening;

a diaphragm having an opening, a first region and a second region, the second region of the diaphragm being inward of the first region along a radial direction of the diaphragm, and the second region of the diaphragm defining the opening of the diaphragm; and a storage device capable of storing the diaphragm, wherein:

the storage device is outside the housing;

the diaphragm is transferrable via the opening in the housing between a first location in the storage device and a second location in the beam path; and the second region of the diaphragm extends outward relative to the first region of the diaphragm along a direction perpendicular to the radial direction of the diaphragm.

16. The system of claim 15, wherein, when the diaphragm is in second position:

the mirror is the closest optical element in the housing to the diaphragm; and a distance between the second region of diaphragm and the mirror is less than a distance between the first region of the diaphragm and the mirror.

17. The system of claim 15, wherein the diaphragm has a third region between the first and second regions of the diaphragam, and the third region of the diaphragm is nonparallel with respect to the first and second regions of the diaphragm.

18. The system of claim 17, wherein the first region of the diaphragm is parallel to the second region of the diaphragm.

19. The system of claim 15, wherein the first region of the diaphragm is parallel to the second region of the diaphragm.

20. A method, comprising:

transferring a diaphragm from a first position outside a housing a microlithography objective to a second position in a beam path of the microlithography objective, wherein:

the diaphragm has an opening, a first region and a second region inward of the first region along a radial direction of the diaphragm; and the second region of the diaphragm extends outward relative to the first region of the diaphragm along a direction perpendicular to the radial direction of the diaphragm.

21. The optical imaging device of claim 1, wherein the opening of the diaphragm is circular along the radial direction of the diaphragm.

22. The optical imaging device of claim 15, wherein the opening of the diaphragm is circular along the radial direction of the diaphragm.

23. The method of claim 20, wherein the opening of the diaphragm is circular along the radial direction of the diaphragm.

* * * * *

UNITED STATES PATENT AND TRADEMARK OFFICE

CERTIFICATE OF CORRECTION

PATENT NO. : 8,089,707 B2
APPLICATION NO. : 12/700351
DATED : January 3, 2012
INVENTOR(S) : Hermann Bieg et al.

It is certified that error appears in the above-identified patent and that said Letters Patent is hereby corrected as shown below:

Column 8, Line 24, Claim 3, delete “position:” insert -- location: --.

Column 8, Line 60, Claim 13, delete “positions.” insert -- locations. --.

Column 9, Line 28, Claim 16, delete “position:” insert -- location: --.

Column 10, Line 2-3, Claim 17, delete “diaphragam,” insert -- diaphragm, --.

Signed and Sealed this
Twelfth Day of June, 2012

David J. Kappos
*Director of the United States Patent and Trademark Office*